United States Patent
Nies et al.

(10) Patent No.: US 10,510,940 B2
(45) Date of Patent: *Dec. 17, 2019

(54) THERMOELECTRIC GENERATOR

(71) Applicant: AVX Corporation, Fountain Inn, SC (US)

(72) Inventors: Craig W. Nies, Myrtle Beach, SC (US); Andrew P. Ritter, Simpsonville, SC (US)

(73) Assignee: AVX Corporation, Fountain Inn, SC (US)

(*) Notice: Subject to any disclaimer, the term of this patent is extended or adjusted under 35 U.S.C. 154(b) by 0 days.

This patent is subject to a terminal disclaimer.

(21) Appl. No.: 15/010,926

(22) Filed: Jan. 29, 2016

(65) Prior Publication Data
US 2016/0149109 A1    May 26, 2016

Related U.S. Application Data

(62) Division of application No. 14/209,540, filed on Mar. 13, 2014.

(60) Provisional application No. 61/789,652, filed on Mar. 15, 2013.

(51) Int. Cl.
*H01L 35/32* (2006.01)
*H01L 35/34* (2006.01)
*H01L 35/06* (2006.01)
*H01L 35/08* (2006.01)
*H01L 35/22* (2006.01)

(52) U.S. Cl.
CPC ............ *H01L 35/325* (2013.01); *H01L 35/06* (2013.01); *H01L 35/08* (2013.01); *H01L 35/22* (2013.01); *H01L 35/32* (2013.01); *H01L 35/34* (2013.01)

(58) Field of Classification Search
CPC .......................................... H01L 35/00–35/34
USPC ................................................... 136/200–242
See application file for complete search history.

(56) References Cited

U.S. PATENT DOCUMENTS

| | | |
|---|---|---|
| 5,168,339 A | 12/1992 | Yokotani et al. |
| 5,288,336 A | 2/1994 | Strachan et al. |
| 5,430,322 A | 7/1995 | Koyanagi et al. |
| 6,005,182 A | 12/1999 | Imanishi et al. |
| 6,091,014 A | 7/2000 | Eklund et al. |
| 6,747,572 B2 * | 6/2004 | Bocko .................... G01K 1/024 136/236.1 |
| 7,351,906 B2 | 4/2008 | Yotsuhashi et al. |

(Continued)

OTHER PUBLICATIONS

Circuit Crush, "Getting Grounded: Types of Electrical Grounding and What They Mean", https://circuitcrush.com/types-of-electrical-grounding/. Accessed online Sep. 28, 2018. (Year: 2018).*

(Continued)

*Primary Examiner* — Liesl C Baumann
(74) *Attorney, Agent, or Firm* — Dority & Manning, P.A.

(57) ABSTRACT

Disclosed are apparatus and methodology for constructing thermoelectric devices (TEDs). N-type elements are paired with P-type elements in an array of pairs between substrates. The paired elements are electrically connected in series by various techniques including brazing for hot side and/or also cold side connections, and soldering for cold side connections while being thermally connected in parallel. In selected embodiments, electrical and mechanical connections of the elements may be made solely by mechanical pressure.

17 Claims, 12 Drawing Sheets

(56) References Cited

U.S. PATENT DOCUMENTS

| | | | |
|---|---|---|---|
| 7,888,583 B2 | 2/2011 | Lagally et al. | |
| 7,942,010 B2 | 5/2011 | Bell et al. | |
| 8,101,846 B1 | 1/2012 | Schroeder et al. | |
| 8,729,380 B2 | 5/2014 | Stefan et al. | |
| 8,933,317 B2 | 1/2015 | Moczygemba et al. | |
| 9,051,175 B2 | 6/2015 | Matus et al. | |
| 2002/0024154 A1 | 2/2002 | Hara et al. | |
| 2002/0154470 A1 | 10/2002 | Walsh | |
| 2005/0115600 A1* | 6/2005 | DeSteese | H01L 35/08 136/205 |
| 2005/0241690 A1 | 11/2005 | Tajima et al. | |
| 2006/0118160 A1 | 6/2006 | Funahashi et al. | |
| 2006/0157102 A1 | 7/2006 | Nakajima et al. | |
| 2008/0212261 A1* | 9/2008 | Ajayan | H01G 9/155 361/502 |
| 2009/0142984 A1 | 6/2009 | Logunov et al. | |
| 2009/0173932 A1 | 7/2009 | Ohta et al. | |
| 2010/0031986 A1 | 2/2010 | Okamura | |
| 2010/0116308 A1 | 5/2010 | Hayashi et al. | |
| 2010/0132755 A1 | 6/2010 | Uchida et al. | |
| 2011/0016888 A1 | 1/2011 | Haaß et al. | |
| 2011/0088737 A1 | 4/2011 | Nakamura et al. | |
| 2011/0088739 A1 | 4/2011 | Zinn et al. | |
| 2011/0132002 A1 | 6/2011 | Lee et al. | |
| 2011/0132422 A1 | 6/2011 | Yajima et al. | |
| 2011/0139207 A1 | 6/2011 | Edward | |
| 2012/0048321 A1* | 3/2012 | Danenberg | H01L 35/32 136/200 |
| 2012/0055527 A1 | 3/2012 | Zika-Beyerlein | |
| 2012/0097206 A1 | 4/2012 | Sadaoka et al. | |
| 2013/0026427 A1 | 1/2013 | Backhaus-Ricoult et al. | |
| 2013/0061901 A1 | 3/2013 | Tohei et al. | |
| 2013/0187130 A1* | 7/2013 | Matus | H01L 21/308 257/28 |

OTHER PUBLICATIONS

Wunderlich et al.; "Effective Mass and Thermoelectric Properties of $SrTiO_3$—based Natural Superlattices Evaluated by ab-initio Calculations", 24th International Conference on Thermoelectrics, Jun. 19, 2005.

Ohta et al.; "Giant thermoelectric Seebeck Coefficient of a Two-Dimensional Electron Gas in $SrTiO_3$"; Nature Materials, vol. 7; Jan. 21, 2007.

Wunderlich et al.; "Enhanced Effective Mass in Doped $SrTiO_3$ and Related Perovskites"; Physica B: Condensed Matter, vol. 404; Aug. 1, 2009.

Cui et al.; "Thermoelectric Properties of Heavily Doped o-type $SrTiO_3$ Bulk Materials"; Journal of Electronic Materials, vol. 28; Sep. 11, 2009.

PCT International Search Report for PCT International Application No. PCT/US14/27070; completed Jun. 27, 2014; dated Jul. 18, 2014.

PCT Written Opinion of the International Searching Authority for PCT International Application No. PCT/US14/27070; completed Jun. 27, 2014; dated Jul. 18, 2014.

PCT International Search Report for PCT International Application No. PCT/US14/27053; completed Jun. 20, 2014; dated Jul. 28, 2014.

PCT Written Opinion of the International Searching authority for PCT International Application No. PCT/US14/27053; completed Jun. 20, 2014; dated Jul. 28, 2014.

Article—Shin et al., "Li-Doped Nickel Oxide as a Thermoelectric Material," *Jpn. J. Appl. Phys.*, vol. 38, 1999, pp. L1336-L1338.

Article—Wang et al., "Effects of YSZ Additions on Thermoelectric Properties of Nb-Doped Strontium Titanate," *Journal of Electronic Materials*, vol. 29, No. 9, 2010, pp. 1777-1781.

* cited by examiner

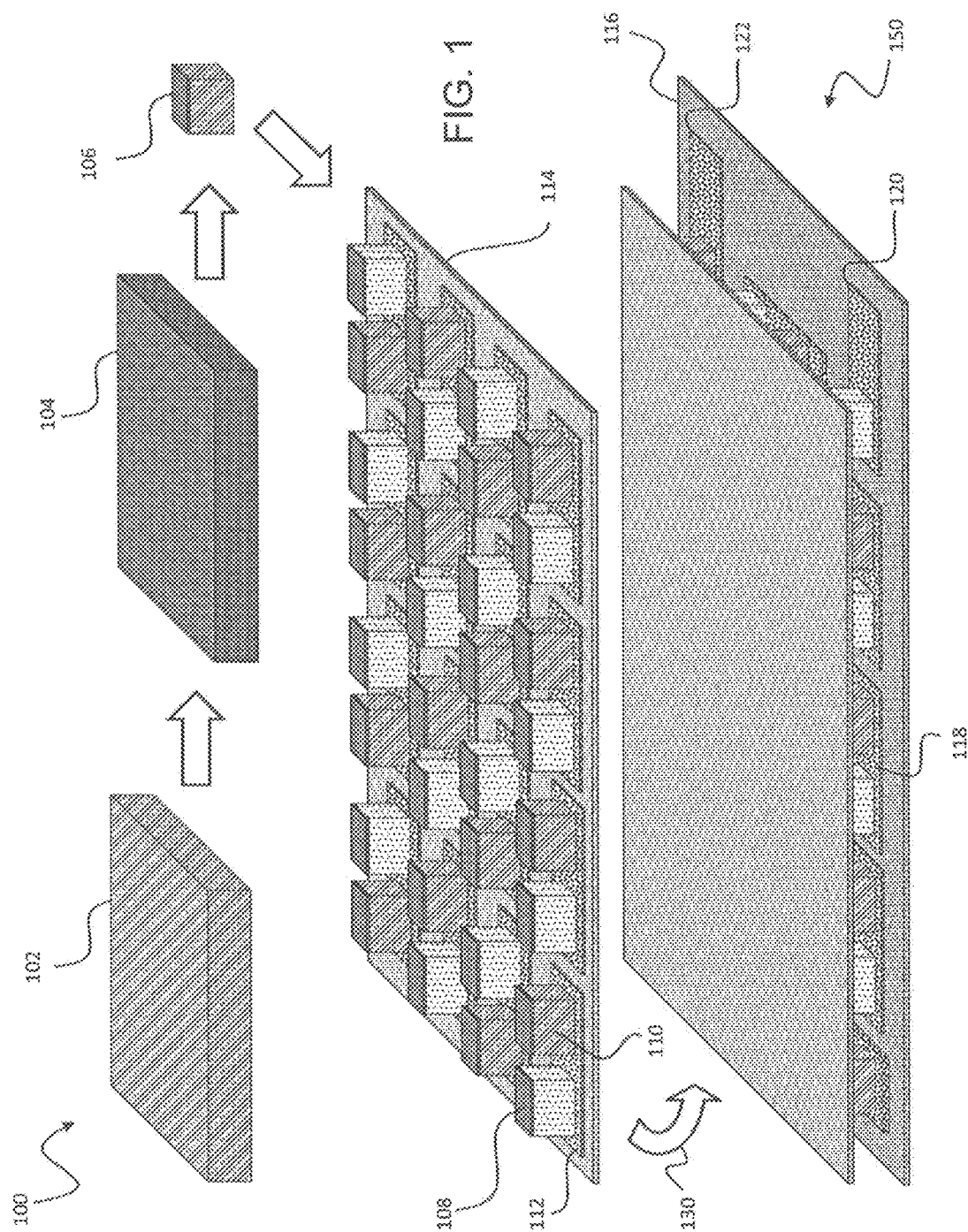

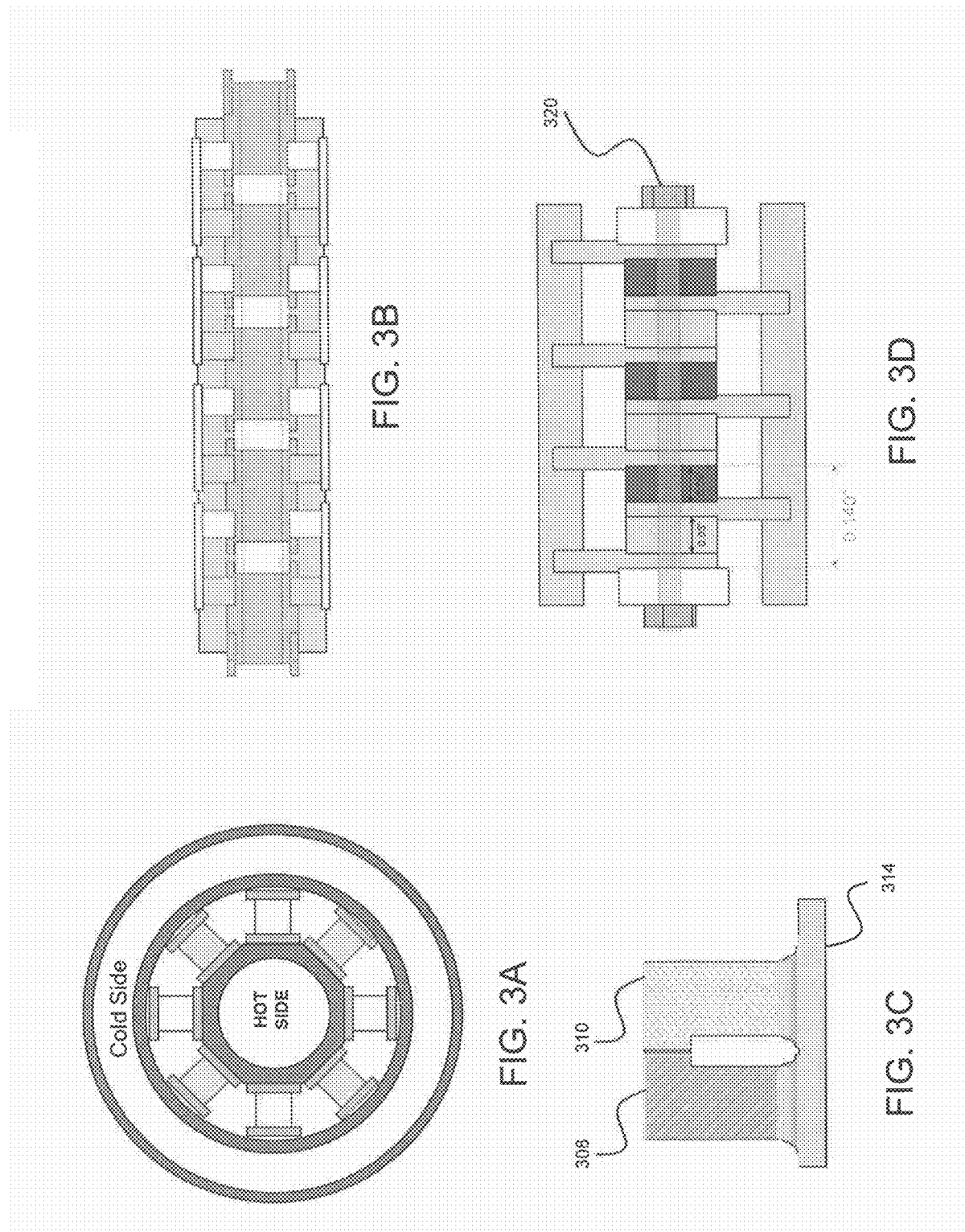

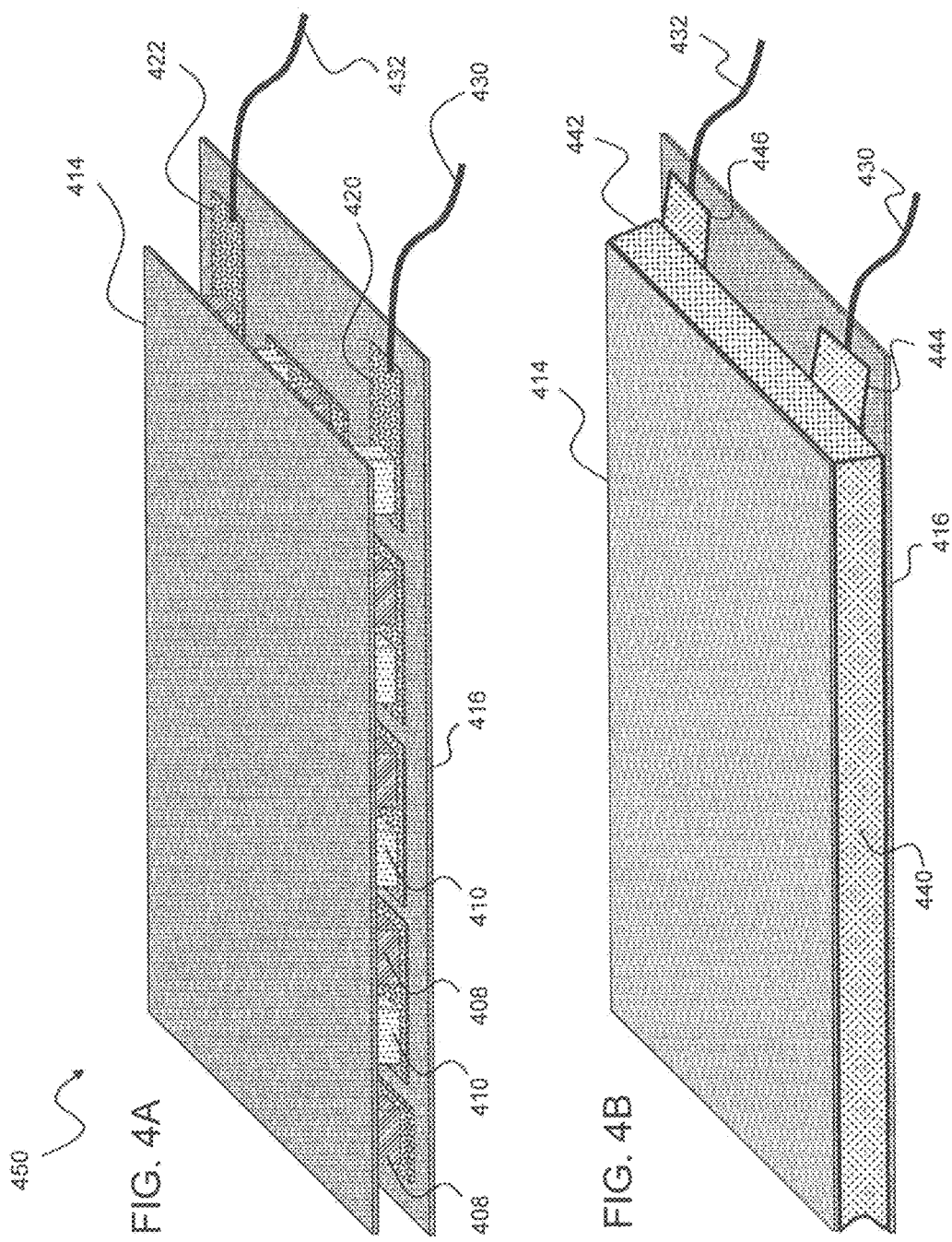

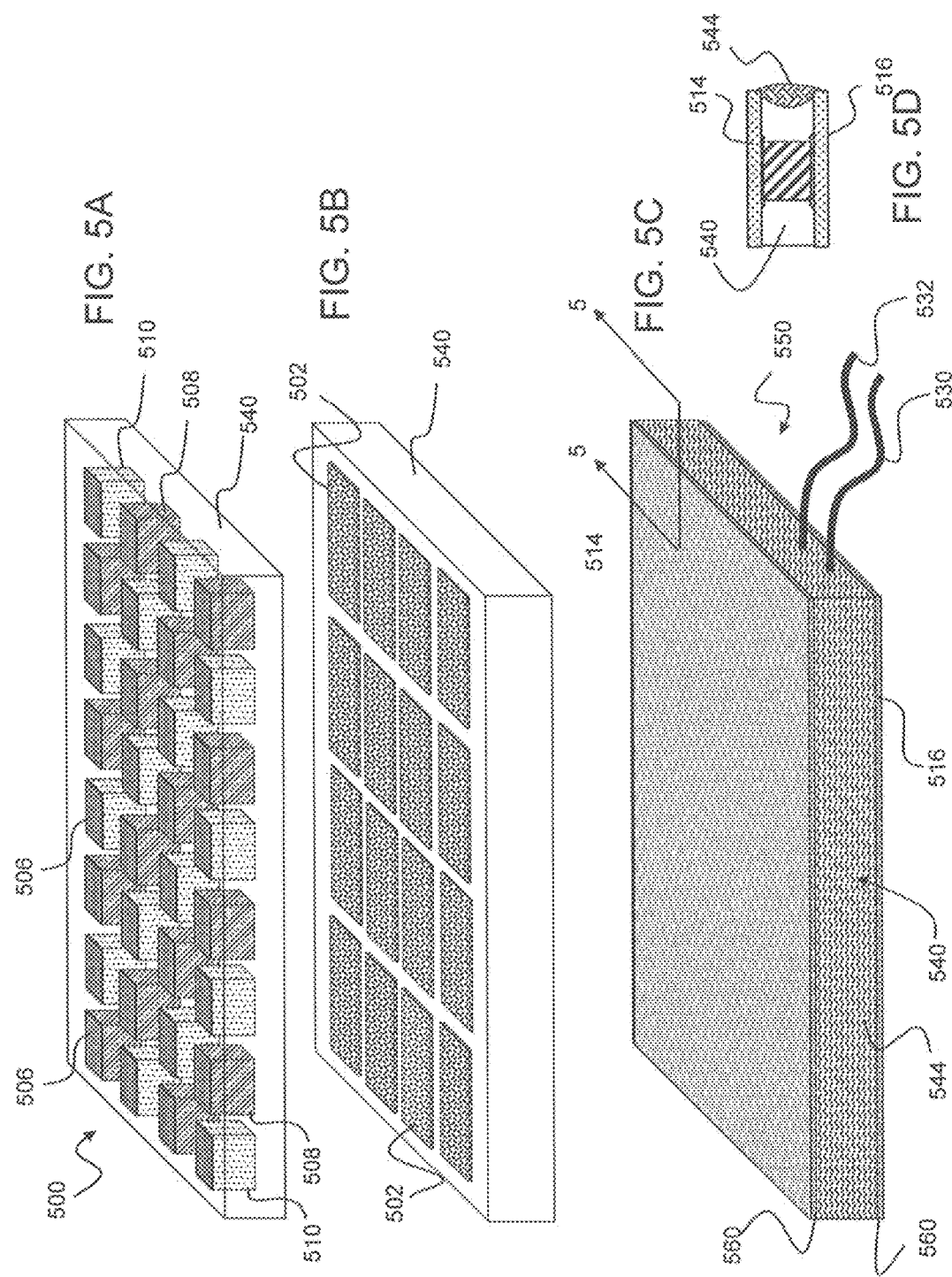

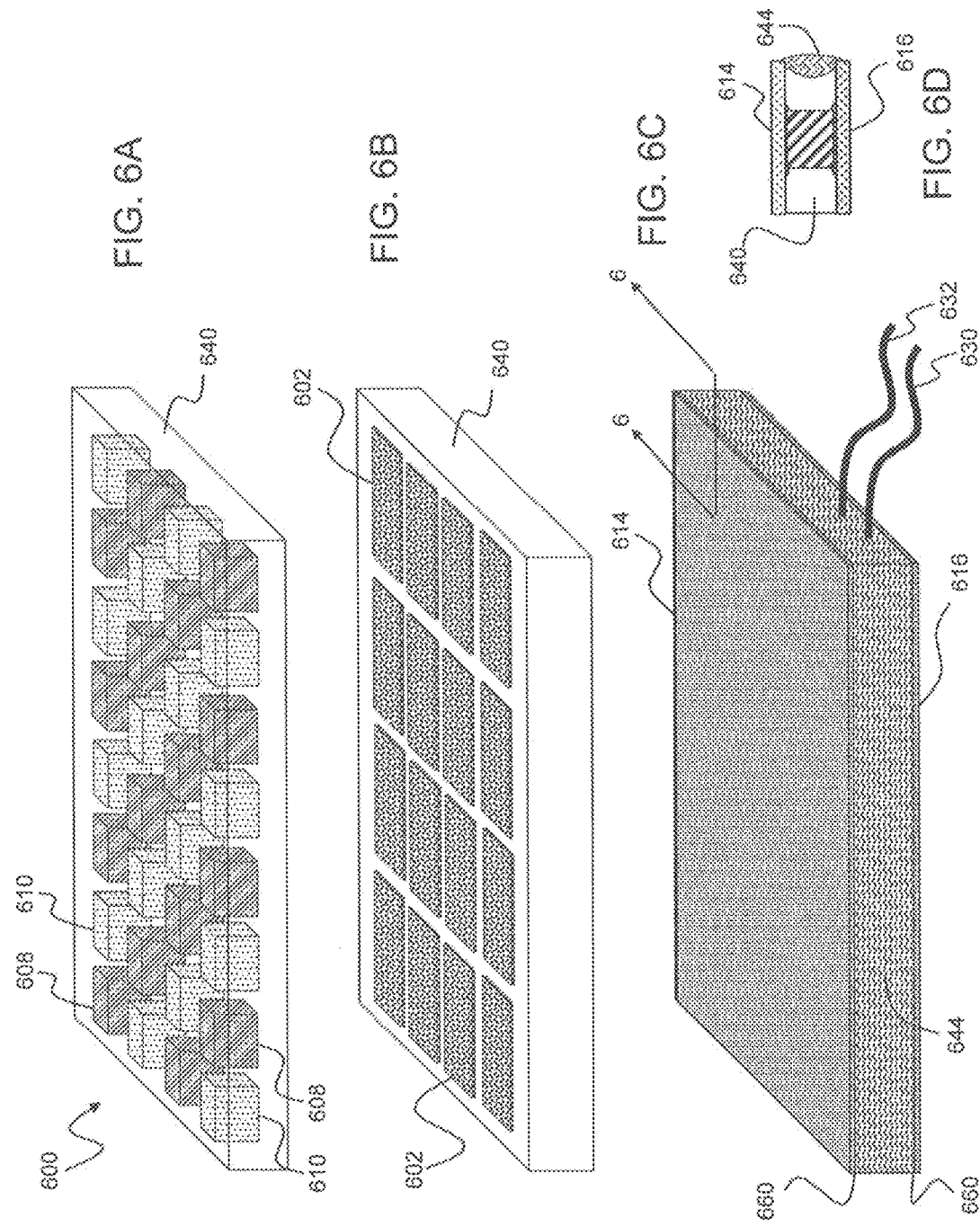

THERMOELECTRIC GENERATOR

PRIORITY CLAIM

This application is a divisional of prior pending U.S. patent application Ser. No. 14/209,540 filed Mar. 13, 2014 entitled "THERMOELECTRIC GENERATOR", which claims the benefit of previously filed U.S. Provisional Patent Application of the same title assigned U.S. Ser. No. 61/789,652, as filed Mar. 15, 2013, which are hereby incorporated herein by reference in their entireties for all purposes. Any disclaimer that may have occurred during prosecution of the above-referenced application(s) is hereby expressly rescinded.

FIELD OF THE SUBJECT MATTER

The presently disclosed subject matter relates to devices for converting thermal energy to electrical energy generators. More particularly, the presently disclosed subject matter relates to thermoelectric generators (TEGs) and methodologies for constructing such devices using electrically coupled doped semiconductive ceramic elements to generate electricity based on temperature differences between portions of the coupled elements.

BACKGROUND OF THE SUBJECT MATTER

The presently disclosed subject matter generally concerns improved component design for generating electrical energy based on the Peltier/Seebeck effect.

Current thermoelectric materials, based on telluride semiconductors and so-called skutterudites and half-heusler alloys, are expensive materials that require specialized processing to fabricate. Such processing may include, for example, drawing boules of material from a melt, epitaxial growth, hot-pressing and spark gap sintering. In addition to the costs involved such processing limits incorporation of other desirable features within the materials.

Known references that include examples of features for thermally generating electricity include U.S. Pat. No. 5,288,336 to Strachan et al. entitled "Thermoelectric energy conversion," U.S. Pat. No. 5,430,322 to Koyanagi et al. entitled "Thermoelectric element sheet in which thermoelectric semiconductors are mounted between films," U.S. Pat. No. 6,005,182 to Imanishi et al. entitled "Thermoelectric conversion module and method of manufacturing the same," U.S. Pat. No. 6,091,014 to Eklund et al. entitled "Thermoelectric materials based on intercalated layered metallic systems," U.S. Pat. No. 7,351,906 to Yotsuhashi et al. entitled "Method of manufacturing crystalline film, method of manufacturing crystalline-film-layered substrate, method of manufacturing thermoelectric conversion element, and thermoelectric conversion element," U.S. Pat. No. 7,888,583 to Lagally et al. entitled "Semiconductor nanowire thermoelectric materials and devices, and processes for producing same," and U.S. Pat. No. 7,942,010 to Bell et al. entitled "Thermoelectric power generating systems utilizing segmented thermoelectric elements."

In addition, examples of U. S. Published patent applications that include features for thermally generating electricity include U. S. Pub 2010/0031986 to Okamura entitled "Thermoelectric Module," U. S. Pub 2010/0116308 to Hayashi et al. entitled "Thermoelectric conversion element, thermoelectric conversion module, method for producing thermoelectric conversion element," U. S. Pub 2010/0132755 to Uchida et al. entitled "Thermoelectric Conversion Material, Method for Producing the Same, Thermoelectric Conversion Device and Method of Improving Strength of Thermoelectric Conversion Material," U. S. Pub 2011/0016888 to Haas et al. entitled "Thermoelectric Module," and U. S. Pub 2011/0088737 to Nakamura et al. entitled "Thermoelectric conversion module and method for manufacturing thermoelectric conversion module."

While various aspects and alternative features are known in the field of thermoelectric electrical energy generation and related methods for manufacture, no one design has emerged that generally addresses all of the issues as discussed herein. The disclosures of all the foregoing United States patents and published patent applications are hereby fully incorporated into this application for all purposes by virtue of present reference thereto.

SUMMARY OF THE SUBJECT MATTER

In view of the recognized features encountered in the prior art and addressed by the presently disclosed subject matter, improved apparatus and methodology for generating electrical energy using multi-layer ceramic elements have been developed.

In an exemplary configuration, thermoelectric modules are constructed by coupling n-type and p-type materials as individual elements to form pairs connected in series electrically, in parallel thermally, and connecting such pairs in an electrically series, thermally parallel configuration.

In exemplary such configurations, the n-type material may in some embodiments be based at least in part on $SrTiO_3$ while the p-type maternal may in some embodiments be based on NiO material. Both materials may incorporate doping materials including, for example, Nb and La with the $SrTiO_3$ and Li with the NiO material. They are produced using various standard ceramic processing techniques, with small variations allowing greater control and enhancement of electrical properties.

The use of ceramic processing to create these elements has the advantages of simplicity and versatility over typical preparation techniques for common thermoelectric elements. For example, many commercial thermoelectric semiconductor materials (for example, bismuth telluride) are produced by common single crystal preparation methods (Czochralski method or zone refining) which are applicable to a more limited materials set, and do not allow microstructural engineering as described herein. On the other hand, ceramic processing as currently practiced can be used on a wide variety of compositions and allows layer-by-layer control of composition and microstructure. Furthermore, thick and thin film techniques can be easily utilized to produce terminations which are conducive to the high temperatures which thermoelectric element will see.

In selected configurations, the n-type and p-type materials may incorporate specific features including porosity variations within the materials, internal electrode structures, and graded chemical structures. Porosity variations within the materials may be employed to control both thermal and electrical (conductivity) aspects of the material. Internal electrode structures may correspond to internal tabs (anchor tabs) within selected portions of the material to assist in bonding other layers or structures to the n-type and p-type materials. In one example, such tabs may be used to provide more effective bonding of electrode layers to the materials. In certain other embodiments, metallic particles within the materials may function in part as anchor points for bonding metallization.

A thermoelectric module may be created by sandwiching pairs of the n-type and p-type elements in such a way as to form a plurality of pairs of elements electrically connected in series while being thermally connected in parallel.

Conventional module construction requires the alignment of tens or hundreds of thermoelectric elements. This process becomes very difficult for high temperature TEGs, where high temperature brazing processes must be used and maintaining alignment with fixturing or adhesives is clumsy. By replacing such process with a low temperature alignment fixture and a "potting technique" using a castable refractory material, the process is greatly simplified.

One present exemplary embodiment relates to a thermoelectric device for converting thermal energy to electrical energy based on temperature differences between portions of the device, comprising a plurality of N-type oxide ceramic elements; a plurality of P-type oxide ceramic elements, respectively paired with such plurality of N-type elements; a pair of supporting generally planar ceramic substrates, supporting a plurality of conductive traces thereon, and with such paired N-type and P-type elements received on selected of such conductive traces so as to form an array of such pairs captured between such substrates; potting material captured between such substrates inbetween such array pairs; and at least one pair of connection terminals provided on at least one of such substrates, and associated lead wires respectively connected thereto. With such embodiment, preferably such paired elements are electrically connected in series by such conductive traces and thermally connected in parallel relative to such substrates, so that generated electricity may be conducted from such array based on temperature differences between portions of such paired elements based on the Peltier/Seebeck effect.

Another present exemplary embodiment relates to a thermoelectric generator module for converting thermal energy to electrical energy using electrically coupled doped semiconductive ceramic elements to generate electricity based on temperature differences between portions of the module based on the Peltier/Seebeck effect, comprising a plurality of N-type elements, each comprising a doped semiconductive oxide ceramic element; a plurality of P-type elements, each comprising a doped semiconductive oxide ceramic element, respectively paired with such plurality of N-type elements; a pair of supporting ceramic substrates, supporting a plurality of conductive traces thereon, and with such paired N-type and P-type elements received on selected of such conductive traces so as to form an array of such pairs between such substrates, with such paired elements electrically connected in series by such conductive traces and thermally connected in parallel relative to such substrates; and at least one pair of connection terminals provided on at least one of such substrates, for the connection of leads thereto. Per such embodiment, preferably such plurality of N-type and P-type elements comprise structures which create non-uniform concentrations of at least one of porosity, metallization, and chemical composition of such elements, to provide selected thermal expansion and bonding properties of such elements.

Another present exemplary embodiment relates to a thermoelectric generator module for converting thermal energy to electrical energy based on temperature differences between portions of the module based on the Peltier/Seebeck effect, comprising a plurality of N-type oxide ceramic elements; a plurality of P-type oxide ceramic elements, respectively paired with such plurality of N-type elements; a pair of supporting ceramic substrates, supporting a plurality of conductive traces thereon, and with such paired N-type and P-type elements received on selected of such conductive traces so as to form an array of such pairs between such substrates, with such paired elements electrically connected in series by such conductive traces and thermally connected in parallel relative to such substrates; and at least one pair of connection terminals provided on at least one of such substrates, for the connection of leads thereto. With such embodiment, preferably such plurality of N-type and P-type elements comprise structures of preselected physical shape, to provide selected average resistance of such elements relative to temperature.

Yet another presently disclosed exemplary embodiment relates to a charging circuit for charging a storage device, comprising a thermoelectric generator module and a linear voltage converter. Preferably such thermoelectric generator module is for converting thermal energy to electrical energy based on temperature differences between portions of the module based on the Peltier/Seebeck effect, and comprises a plurality of N-type oxide ceramic elements; a plurality of P-type oxide ceramic elements, respectively paired with such plurality of N-type elements; a pair of supporting ceramic substrates, supporting a plurality of conductive traces thereon, and with such paired N-type and P-type elements received on selected of such conductive traces so as to form an array of such pairs between such substrates, with such paired elements electrically connected in series by such conductive traces and thermally connected in parallel relative to such substrates; and at least one pair of output terminals provided on at least one of such substrates, for providing an output voltage from such module. Preferably, such linear voltage converter is operatively interconnected for receiving the output voltage from such module and converting such module output voltage to a relatively higher output voltage for charging a storage device.

Those of ordinary skill in the art will appreciate from the complete disclosure herewith that the presently disclosed subject matter equally relates to apparatus as well as corresponding and/or related methodologies. One present exemplary embodiment relates to methodology for generating electrical energy based on the Peltier/Seebeck effect using oxide ceramic elements by providing a thermoelectric module constructed by coupling N-type and P-type materials as individual elements to form pairs electrically connected in series and thermally in parallel between opposing supporting generally planar substrates, further including providing potting material captured between such substrates inbetween such array pairs, and providing bonding pads on at least one of such supporting substrates, electrically connected so to allow connection of the module to either an electrical load which will use the thermoelectric power generated or to other thermoelectric modules in series to increase the voltage or current and therefore the overall power generated.

Yet another exemplary method relates to methodology for manufacturing a thermoelectric generator module for converting thermal energy to electrical energy using electrically coupled doped semiconductive oxide ceramic elements to generate electricity based on temperature differences between portions of the module based on the Peltier/Seebeck effect, comprising providing an opposing pair of generally planar supporting ceramic substrates, supporting a plurality of complementary conductive traces thereon; placing an array of plural paired N-type elements and P-type elements in electrical communication with such conductive traces so that the paired elements are electrically connected in series by such conductive traces, such elements each comprising a doped semiconductive oxide ceramic element, and such that such elements are thermally connected in parallel relative to such substrates; and attaching at least one pair of connection terminals on at least one of such substrates, for the connection of leads thereto, so that generated electricity may be conducted from such array via such connection terminals based on temperature differences between portions of such paired elements. Per such exemplary method, preferably such plurality of N-type and P-type elements are formed as structures with non-uniform concentrations of at least one of porosity, metallization, and chemical composition of such elements, to provide selected thermal expansion and bonding properties of such elements.

In still another present exemplary embodiment, a method of providing a thermoelectric device for converting thermal energy to electrical energy based on temperature differences between portions of the device based on the Peltier/Seebeck effect. Such method preferably comprises forming respective pluralities of N-type and P-type oxide ceramic elements; providing a pair of ceramic substrates with a plurality of predetermined conductive traces thereon; respectively pairing and aligning such N-type and P-type elements on selected of such conductive traces so as to form an array of such pairs electrically connected in series and captured between such substrates and thermally connected in parallel between opposing determined hot and cold sides thereof; and forming at least one pair of connection terminals on at least one of such substrates, for the connection of leads thereto, so that generated electricity may be conducted from such array based on temperature differences between such hot and cold sides. Per such method, preferably such plurality of N-type and P-type elements comprise structures of preselected physical shape, to provide selected average resistance of such elements relative to temperature.

Still a further present exemplary method relates to methodology for charging a storage device, comprising providing a thermoelectric generator module for converting thermal energy to electrical energy based on temperature differences between portions of the module based on the Peltier/Seebeck effect, comprising a plurality of N-type oxide ceramic elements; a plurality of P-type oxide ceramic elements, respectively paired with such plurality of N-type elements; a pair of supporting ceramic substrates, supporting a plurality of conductive traces thereon, and with such paired N-type and P-type elements received on selected of such conductive traces so as to form an array of such pairs between such substrates, with such paired elements electrically connected in series by such conductive traces and thermally connected in parallel relative to such substrates; and at least one pair of output terminals provided on at least one of such substrates, for providing an output voltage from such module; and using a linear voltage converter operatively interconnected for receiving the output voltage from such module, to convert such module output voltage to a relatively higher output voltage for charging a storage device.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which:

FIG. 1 illustrates an exemplary assembly process for constructing thermoelectric generators (TEGs) in accordance with the presently disclosed subject matter;

FIGS. 3A-3D respectively provide alternative exemplary configurations of an exemplary thermoelectric device in accordance with the presently disclosed subject matter;

FIGS. 4A and 4B respectively illustrate aspects of a first exemplary assembly configuration for a TEG constructed in accordance with the presently disclosed subject matter;

FIGS. 5A-5D respectively illustrate aspects of a further exemplary assembly configuration per presently disclosed subject matter employing potted pre-metallized elements;

FIGS. 6A-6D respectively illustrate aspects of a still further exemplary assembly configuration per presently disclosed subject matter employing potted non-metallized elements;

Figure 2A:
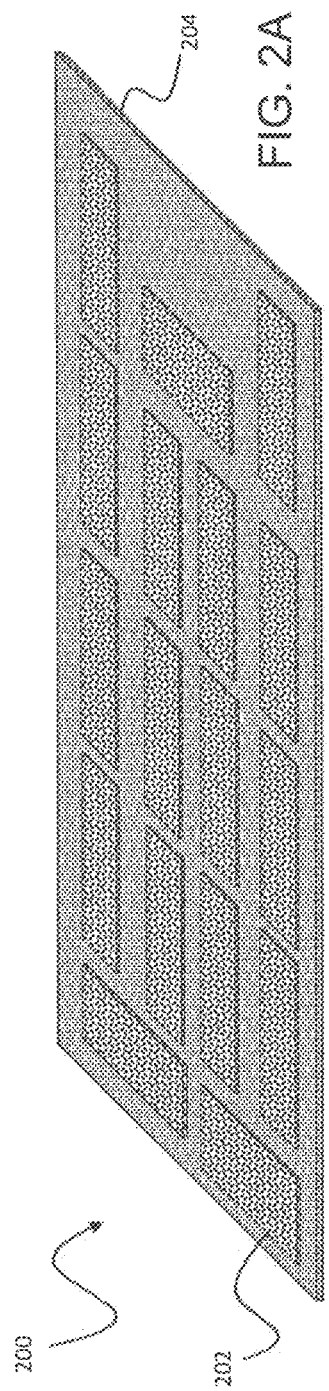
FIGS. 2A-2C illustrate an alternative embodiment of the presently disclosed subject matter employing screen-printed substrates.

Repeat use of reference characters throughout the present specification and appended drawings is intended to represent same or analogous features, elements, or steps of the presently disclosed subject matter.

DETAILED DESCRIPTION OF THE PREFERRED EMBODIMENTS

As discussed in the Summary of the Subject Matter section, the presently disclosed subject matter is particularly concerned with improved apparatus (devices) for generating electrical energy based on the Peltier/Seebeck effect and methodologies for constructing such devices.

Selected combinations of aspects of the disclosed technology correspond to a plurality of different embodiments of the presently disclosed subject matter. It should be noted that each of the exemplary embodiments presented and discussed herein should not insinuate limitations of the presently disclosed subject matter. Features or steps illustrated or described as part of one embodiment may be used in combination with aspects of another embodiment to yield yet further embodiments. Additionally, certain features may be interchanged with similar devices or features not expressly mentioned which perform the same or similar function or functions.

Reference is made in detail herein to presently preferred exemplary embodiments of the subject thermoelectric generators and methodologies for constructing such generators. With initial reference to FIG. 1, there is illustrated an exemplary assembly process generally 100 for constructing exemplary thermoelectric generators (TEGs) in accordance with the presently disclosed subject matter. Assembly process 100 begins with the formation of blanks 102 of both p-type and n-type materials that are then formed into individual oxide thermoelectric elements as described herein. As will be understood by those of ordinary skill in the art from the complete disclosure herein, process 100, for simplicity of illustration, illustrates only a single block 102 representative of both p-type and n-type material blocks.

To construct a thermoelectric module such as exemplary module generally 150, elements of p-type and n-type semiconducting materials are preferably used. Such materials may be prepared from common ceramic raw materials, using standard ceramic engineering processing, with the following general procedure.

In accordance with the presently disclosed subject matter, ceramic materials and processing methods may be used that have been generally adopted by the Multi-Layer Ceramic Capacitor (MLCC) industry, with certain adjustments, as will be more fully described hereinafter, to enhance desirable features of thermoelectric materials while mitigating potentially undesirable features thereof.

For example, in certain embodiments of the presently disclosed subject matter, calcined and "cake-batch" powder synthesis with low-cost starting materials are used. As is understood by those of ordinary skill in the art, such methods are common in the MLCC industry. On the other hand, however, whereas MLCC ceramics are desirably insulating materials (e.g., dielectrics), thermoelectric materials are chemically doped and sintered in such conditions to form a surplus of mobile charge carriers (e.g., semiconductors) and are low electrical resistance materials.

An n-type semiconducting oxide ceramic composition in accordance with the presently disclosed subject matter may be constructed primarily of strontium titanate ($SrTiO_3$) with from 0 to 5 weight percent of added such as strontium oxide, niobium oxide, lanthanum oxide, bismuth oxide, silicon dioxide, aluminum oxide, sodium oxide, tantalum oxide, neodymium oxide, cerium oxide, molybdenum oxide, tungsten oxide and/or titanium dioxide to create a strongly semiconducting composition. These components may be added in the form of oxides, carbonates, nitrates, acetates or any other reagents bearing the correct cation.

Similarly, a p-type semiconducting oxide ceramic composition in accordance with the presently disclosed subject matter may be constructed primarily of nickel oxide with from 0 to 8 weight percent of added lithium oxide, sodium oxide, potassium oxide and/or bismuth oxide. Such components may be added in the form of oxides, carbonates, nitrates, acetates or any other reagents bearing the correct cation.

The n-type and p-type compositions may be separately blended and calcined to form one or more solid solution ceramic materials which are then milled to approximately 1 um average particle size, prior to binder addition and green body forming operations. Alternatively, such materials may be cake batched and milled in an appropriate solvent (aqueous or non-aqueous) for green formation. Following this, an appropriate binder is added and green forming is performed. In such case, the calcination would occur during the firing operation, forming one or more solid solution ceramic materials at that time.

A green body formation technique is then preferably utilized which will allow the formation of ceramic blanks 102 from which individual elements 106 will be cut. The green body formation technique used can be selected from several different choices, depending on the degree of complexity and desired properties of the final ceramic n-type or p-type element. Non-limiting examples of exemplary techniques for forming ceramic blanks 102 include die-pressing, extrusion, tape casting, and wet laydown.

In an exemplary die-pressing process, the milled ceramic powder or slurry formulation may be mixed with a solution of polymers including binders and plasticizers, then dried and granulated to produce a dry pressing feedstock. The feedstock may then be dry-pressed to form disks or plates.

In an exemplary extrusion process, the ceramic powders are combined with organic binder system (in either an aqueous or organic solvent carrier) to form a doughlike feedstock, which may then be extruded to form rods, bars or plates of any advantageous cross-section. Such rods, bars, or plates may then be diced across their cross-section to form the ceramic blanks.

In an exemplary tape casting process, the milled ceramic slurry may be combined with a binder solution system to form a slip. The ceramic slips are tape cast into layers ranging from 0.5 micron up to 100 microns or more. Such layers may be stacked to the desired thickness and then laminated, forming green ceramic pads, which may be saw-diced or blade-diced to form the ceramic blanks.

In an exemplary wet laydown process, the milled ceramic slurry is combined with a binder solution system to form a somewhat different slip, which may be successively applied to a carrier plate and dried. Representative non-limiting examples of application methods of the slip to the carrier include, for example, doctor blading, screen printing, spraying, or waterfall casting. In such manner, a pad of the correct thickness is built up on the carrier plate. The final pad is dried and may be diced to form ceramic blanks 102 either before or after release from the carrier plate.

Because each of such exemplary alternative methods can allow for multiple layers to be combined into the green body, a highly engineered ceramic body with controlled composition and microstructure may be formed. A benefit of such green-body fabrication techniques is that a variety of features may easily be incorporated into the thermoelectric elements, i.e. the elements may be "engineered". Such features include, without limitation, dispersion of fine porosity to reduce thermal conductivity while largely maintaining low electrical conductivity; dispersion of discrete metal particles, especially at the "ends" of the element to facilitate joining of elements to metallized substrates; incorporation of floating tab electrodes, similar to so-called dummy electrodes (anchor tabs) used in Fine Copper Termination (FCT) to help anchor external metallization to the "ends" of the elements; and graded and/or lamellar structures that may be employed to create non-uniform concentrations of porosity, metallization and/or chemical composition typically, but not exclusively, along the axis perpendicular to the end-caps of the device. It should be appreciated by those of ordinary skill in the art that combinations of such features can be used to manipulate thermal expansion properties to reduce stress gradients between dissimilar materials. Attributes obtained from such engineered elements include achievement of low thermal conductivity, high electrical conductivity, and durable high-temperature bonds between element and substrate.

It should also be appreciated by those skilled in the art that these techniques might be applied to any other material or combination of materials which may be prepared in a powder form and when thermally treated, will form a material with thermoelectric properties. For example, barium strontium niobate has been prepared in a ceramic form and has been shown to exhibit interesting thermoelectric characteristics. The powder forms of barium strontium niobate precursors and dopants (e.g. niobium or lanthanum oxides) may be combined and formed using the above processes, producing similar microstructural features.

Metal particles such as nickel, copper, silver, palladium, etc., may be added to the slip or feedstock to create a ceramic/metal composite in given layers, particularly outer contact surfaces. Such metal particle addition is advantageous for creating improved electrical contact with external metallization and/or for matching thermal expansion of elements and contacting substrates or headers.

A slip or feedstock with an excess of donor ions for n-type materials and acceptor ions for p-type materials may be used to heavily dope the outer layers of the blanks, where external metallization may be brought in contact with the materials. Heavy doping may be used to achieve strongly ohmic contacts in semiconductors.

Small electrode tabs may be incorporated into the surface of the element, which, when exposed by dicing or polishing, will improve the intimacy of contact between the external metallization and the ceramic, and provide anchoring points for applied external metallization layers. In accordance with the presently disclosed subject matter, such metallization layers may be applied using plating, sputtering, evaporation, screen printing techniques, or other known or future developed processes.

Tape casting and wet buildup are presently generally preferred methods for some embodiments as such methods generally provide greater thickness control and finer resolution than can be achieved using other methods. Other methods may, however, be employed depending on the precision required for construction of particular embodiments of the presently disclosed subject matter.

It should be noted that at this point, like many conventional ceramic electronic components, elements near their final size could be directly diced from the pads or blanks, rather dicing as blanks, firing the blanks and dicing the fired blanks into elements. The eventual inclusion of blank lapping is advantageous to providing the dimensional control for later alignment of the elements between headers.

Following green forming the organic binders may be removed from the blanks using standard burnout techniques. Blanks containing only ceramic powder or ceramic powder and polymer microspheres may be burned out in air at temperatures of up to 750° C. using slow ramp rates, for example, on the order of 2° C. per minute. Blanks containing metal powders may be burned out in air or in reducing atmosphere depending on the requirements of the metal to avoid deleterious oxidation or reduction reactions. Removal of nearly all of the organic material is generally desirable as remaining carbon may influence the furnace atmosphere during firing, or cause delamination or other green defects during firing. A single layer of parts on each setter is generally recommended.

The blanks 102 may then be fired to densify the body, create the desired microstructure, and distribute the dopants to yield a strongly semiconducting body. Each ceramic composition generally has its own preferred firing profile. For example, the strontium titanate-based n-type material typically would be fired at temperatures ranging from 1275 to 1400° C. for 2 to 16 hours in a reducing atmosphere with oxygen partial pressures ranging from 10-6 to 10-18 atm. The nickel oxide p-type ceramic typically would be fired at temperatures ranging from 1225 to 1400° C. for 1 to 4 hours in an air or otherwise oxidizing environment.

During firing, minimization of the amount of camber in the fired blanks is important. For example, following burnout, the blanks may be positioned on the firing setters and covered with weighted plates to encourage flatness. Alternatively, blanks may be fired in stacks as a technique for generally maintaining flatness during firing. Maintaining flatness allows the ceramic to be more easily polished to a consistent thickness. Also, firing in stacks or surrounding the material with a similar composition of ceramic assists in controlling the loss of any volatile components from the blanks (e.g. lithium from NiO) to the setters or furnace environment.

Individual elements 106 may be cut from the fired blanks 102 or from plated blanks 104. During module construction, elements 106 may be sandwiched between two metallized insulators or "headers." Because elements 106 generally are to be aligned with contacts in the same plane, it is preferable to maintain dimensional control over them in such direction. As noted, individual elements can also be cut from greenware, prior to firing. This substantially avoids issues related to camber, but requires appropriate fired dimensional control and suitable termination procedures.

Maintenance of dimensional control may be achieved in several ways. In accordance with exemplary such ways, the fired blanks may be lapped, for example using double-sided grinding, to a consistent thickness. Such process may be advantageous when metal or additional doping is used in the outer layers for electrical contact or bonding purposes. In such case, the substrates will be metallized as represented by structure 104 after the lapping procedure but before the element dicing procedure.

Alternatively, the blanks may be diced such that the thickness of the element is dictated by the lateral dimension during dicing. Such technique is advantageous when tab electrodes are created in the blank and are exposed by dicing, again to enhance bonding and contact. In such case, the parts will be diced into strips to expose the tabs and the tab surfaces would then be metallized. After surface metallization, an additional dicing to singulate the elements 106 from the strips would preferably be performed.

The desired metallization may then be applied to the correct surfaces. It is preferable per the presently disclosed subject matter to select metallization which yields a strong ohmic contact, with good mechanical adhesion. The desired procedure typically starts with a rigorous cleaning procedure using solvents such as alcohols and acetone, and ceramic etchants such as fluoboric acid and hydrogen peroxide, followed by thorough drying.

Metallization preferably may then proceed as follows. For the n-type strontium titanate elements, a sputter etch may be performed, followed by a sputtered layer of, for example, 1000 angstroms of titanium-tungsten. Such step is followed by a layering of, for example, 1000 angstroms of nickel which may contain some vanadium. Finally, the nickel layer may be capped by approximately 100 angstroms of sputtered gold. Such layers serve as an adhesion layer on which other surface metallization may be deposited, for example by electroplaing. In an exemplary construction, an electroplated layer may be approximately 10-25 microns thick and may correspond to copper, silver, gold, nickel, nickel-phosphorus or any metal producing a relatively low resistance contact and favorable bonding with the header metallization.

For the p-type nickel oxide elements, various methods may be used to create an adhesion layer. In a first exemplary method, cleaned surfaces may be activated with palladium and then coated with copper via electroless plating. In an exemplary configuration, the copper plating may be 0.5 to 5 microns thick. In a second exemplary configuration, a sputter etch may be performed followed by application of a sputtered layer of nickel that optionally contains some vanadium, and a sputtered layer of gold. In an exemplary configuration, the nickel layer may be about 1000 angstroms thick while the gold layer may be about 100 angstroms thick. Following either of such approaches, contact metallization may again be deposited, for example by electroplating, to approximately 10-25 microns thick, and again may consist of copper, silver, gold, nickel, or any metal producing a low resistance contact and favorable bonding with the header metallization.

The n-type or p-type elements may then be diced from such substrates to dimensions giving adequate thermal insulation and low electrical resistance. In exemplary configurations, size may range from 125 microns in length, width and height to greater than 3 millimeters in each dimension, and may resemble such as rods, bars, or cubes. The dicing procedure should preferably result in electroded surfaces on opposite sides of each element, for property testing and eventual module construction.

With further reference to FIG. 1, thermoelectric modules generally 150 are assembled from p-type and n-type representative elements 106 where the elements 106 are typically of uniform size and properties. Elements 106 are arranged in pairs of p-type 108 and n-type 110 elements which are connected in series, for example, by way of representative conductive traces 112 on substrate 114. Configurations may also be used that combine series/parallel electrical connection—in order to manipulate device resistance (desirably low) while elements are thermally in parallel. In such manner, each couple contributes a characteristic amount of voltage for a given temperature difference between hot and cold surfaces which add together to yield the total voltage produced by the module. Because the elements are connected in series, the resistance for each couple also is additive; however, such resistance is detrimental to the overall power output by the module. It is, therefore, relatively important in preparing modules to preferably avoid as possible any increase in the overall resistance during the assembly of the modules 150.

With continued reference to FIG. 1, an exemplary procedure is represented for preparing sandwich-type modules consisting of one or more unicouples composed of oxide ceramic elements. In an exemplary such methodology in accordance with the presently disclosed subject matter, headers 114, 116, or ceramic substrates, with appropriate metallizations (representatively metallizations 112, 118), are fabricated from suitable materials including, for example and without limitation, aluminum oxide, aluminum nitride or other relatively high thermal conductivity, electrically insulating ceramic substrates. In exemplary configurations, such substrates may be formed with thicknesses typically ranging from 250 to 625 microns. Metallization can be applied by either thick film (screen printing/firing) or thin film (sputtering, evaporation, plating) techniques.

On one surface of each header 114, 116, the metallization 112, 118 may be preferably patterned to form the series connection between elements 108, 110, while generally a complete sheet of metallization will be applied to the other. Such approach is meant to facilitate thermal transfer between the heat source and the module on the hot side, and to facilitate heat removal from the cold side by adjunct or associated cooling reservoirs, coils, fins or air flow (not separately illustrated, details of which form no particular aspect of the presently disclosed subject matter). Such metallization may facilitate the physical bonding of heating and/or cooling structures to the presently disclosed exemplary module.

In exemplary configurations of thick film metallization, copper, nickel, silver, silver, palladium, platinum, or gold pastes, or pastes composed of alloyed powders of such, may be used. The selection would generally depend on the resistance desired and the type of bonding between element and header, or heat exchanging structure and header, for a particular embodiment. The selection would also dictate the firing profile needed to bond the metallization to the header.

In exemplary configurations of thin film metallizations, substrates are rigorously cleaned using solvents such as alcohols and acetone, and ceramic etchants such as fluoboric acid and hydrogen peroxide, followed by thorough drying. Following such step, a sputter etch may be performed, followed by applying a sputtered layer, such as of 1000 angstroms of titanium-tungsten. Such step is followed by 1000 angstroms of nickel (containing some vanadium), which is capped by approximately 100 angstroms of sputtered gold. Such layers serve to act as an adhesion layer, on which other surface metallization may be electroplated. Electroplating is approximately 5-25 microns thick, and may consist of copper, silver, gold, nickel, or any metal producing a relatively lower resistance contact and favorable bonding with the element metallization.

While the above-described thin film method is one presently favored, other adhesion layer materials may also be used. For example, copper-chromium-gold layers of metallization are known to provide good adhesion to ceramic substrates and devices. Also, a fired thick film layer may provide a well-adhered base for a plated layer of the various metals mentioned above.

Whereas screen printing thick film materials will provide the correct pattern to create the series connection for the ceramic elements, the thin film materials likely are patterned either by masked deposition or by conventional photolithographic techniques.

To begin module assembly, a method of alignment is selected to place the n-type and p-type parts in alternating positions directly over their metallized locations on the headers. Alignment may be accomplished in a number of ways including, without limitation, using alumina or graphite spacer bars or alignment forms with holes drilled at the appropriate locations. An appropriate bonding material (preform or paste) should also be placed on, or applied to, the metallization prior to element placement.

Because the modules will likely be better used with at least the hot-side header at temperatures exceeding 500° C., high temperature appropriate bonding techniques are preferably used for assembly. Also, effective use of the ceramic elements may, in some instances, require that the cold side exceed 150° C., which would prohibit use of a variety of low temperature brazes or solders. In accordance with the presently disclosed subject matter, several techniques may be used, including, without limitation: brazing both hot and cold sides simultaneously, using braze filler materials such as alloys of primarily copper and silver; and brazing hot and cold sides separately, allowing a high temperature bonding material such as a copper-silver alloy to be used on the hot side and a lower temperature alloy (such as high lead solder) to be used on the cold side. Additionally, copper-copper thermocompression bonding may be employed on at least the hot side of the module. Such process requires that copper surface layers be present during bonding and that the elements be uniform in size so that the pressure is uniform throughout each bonded surface.

Termination paste bonding involves use of a copper, nickel, silver, or alloy termination paste as the bonding medium between the element and the header. Such procedure offers several advantages including creating a bond that is stable at higher temperatures than available from brazing pastes, and the possibility of engineering the composition to minimize thermal stresses between the element and the header. However, it is preferable that excellent density is achieved in the contact region to achieve good electrical and thermal transport.

With continued reference to FIG. 1, bonding pads 120, 122 are provided on the cold side header 116 where wires, pins, or other devices (not separately illustrated, and details of which form no particular aspects of the presently disclosed subject matter) may be soldered or brazed to allow connection of the module to either an electrical load which will use the thermoelectric power generated or to other thermoelectric generators in series to increase the voltage or current and therefore the overall power generated by the assembly.

It should be appreciated from the above that the construction sequence illustrated in FIG. 1 provides for separately forming n-type and p-type elements generally illustrated as element 106 by first forming separate blanks 102 from appropriate materials as previously described and then, optionally, metalizing blank 102 to produce a plated blank 104 which may then be singulated into individual elements 106. Pairs 108, 110 of the singulated elements are then arranged over and secured to metallizations 112 on header 114. Header 114 is then "flipped over" as indicated by arrow 130 and aligned over header 116 which has applied thereto metallizations 118 including terminal connections 120, 122. When the individual elements 106 are electrically connected to metallizations 118, the result is a series connection of a plurality of element pairs. In such configuration, each element pair provides a characteristic voltage output dependent on, among other things, the composition of the elements and the temperature difference between the hot side header 114 and the cold side header 116.

To improve the power output of the device in operation, the highest level of thermal contact between the exterior surfaces of the headers and the heat exchanging surfaces on the hot and cold side should preferably be maintained. Thermal interface materials such as metal sheets, thermal greases, graphite papers, and similar products may be used to improve the thermal contact, allowing more thermal energy to be transmitted to and taken away from the ends of the elements.

Figure 2B:
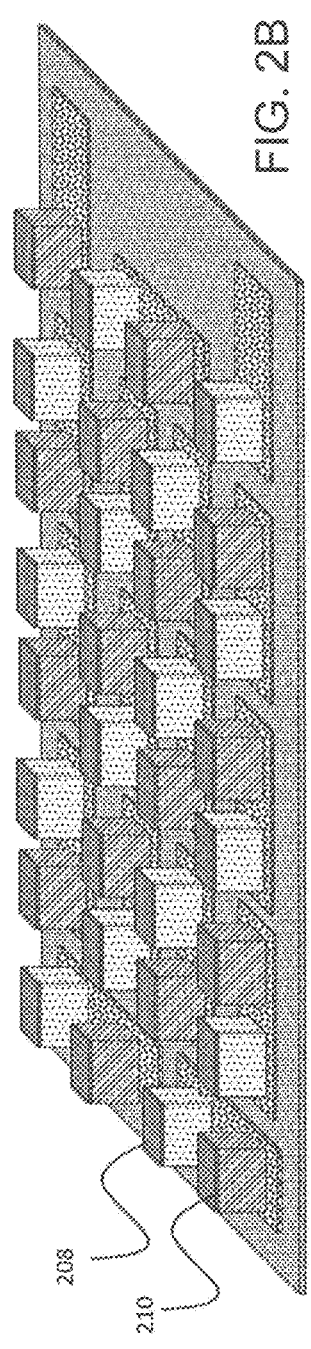
Figure 2C:
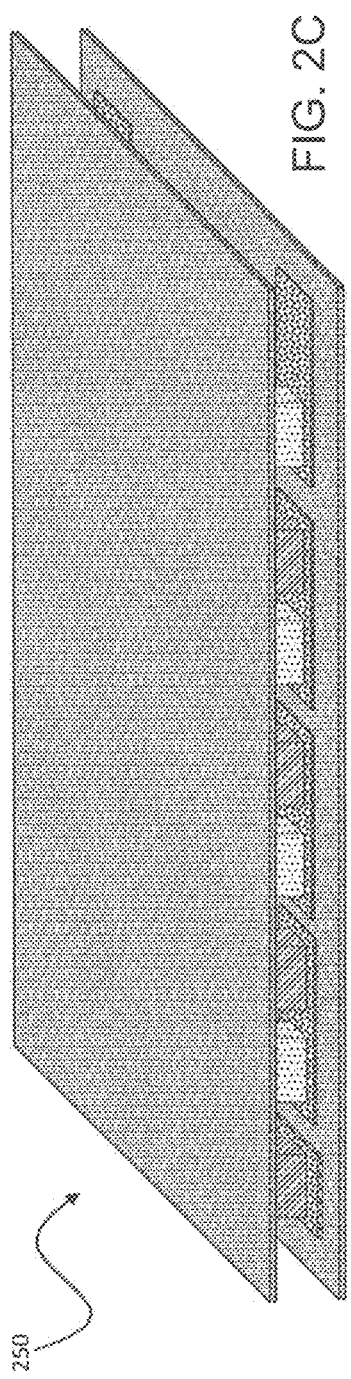

With reference now to FIGS. 2A-2C (generally FIG. 2), there is illustrated an alternative embodiment generally 200 of the presently disclosed subject matter employing screen-printed substrates. As illustrated, screen-printed copper paste 202 is applied to the top and bottom surfaces of substrate 204. The bottom (unseen) surface may have applied thereto copper paste in a configuration that, in conjunction with the illustrated top surface copper paste configuration, will result in an electrical connection of elements 208, 210 into serial connected pairs. An exemplary configuration of the unseen configuration on the bottom surface of substrate 204 may be similar to the metallizations 112 illustrated in FIG. 1 as applied to substrate 114. In accordance with the exemplary embodiment of FIG. 2, substrate 204 may be an $Al_2O_3$ substrate.

During construction of the exemplary embodiment of FIG. 2, the various elements 208, 210 are put in place preferably while the copper paste is still wet, and a top and bottom sandwich 250 is assembled. The sandwich is dried in an alignment fixture (not separately illustrated) and, after drying is removed from the alignment fixture and fired to form copper to copper bonds. Leads may then be attached to connection terminals (representatively illustrated in FIG. 1 as terminals 120, 122).

With reference now to FIGS. 3A-3D, there are illustrated respective additional alternative configurations that may be produced using the same p-type and n-type materials previously described. FIG. 3A illustrates an exemplary radial configuration wherein the "hot side" is centrally located and the "cold side" is on the perimeter of the device. Such an embodiment may be used advantageously for example with heat sources such as a fire or heat from a vehicle exhaust system. FIG. 3B illustrates another exemplary radial structure employing p-type and n-type tubing separated by ceramic rings. FIG. 3C illustrates an exemplary embodiment wherein the hot side of the elements 308, 310 are directly brazed together while the cold side of the elements 308, 310 are soldered to substrate 314. The FIG. 3D exemplary embodiment of the presently disclosed subject matter incorporates a mechanical retention mechanism (nuts and bolts 320) to produce a device that requires neither brazing nor soldering to retain the p-type and n-type elements in solid contact with each other.

As will be understood by those of ordinary skill in the art from the complete disclosure herewith, the presently disclosed subject matter may be particularly useful for adaptation for use in a variety of configurations where temperature differentials may be leveraged. Such may include, for example, pipe-mounted configurations such as for remote sensing, integrated into a wood fuel stove (either involving natural wood or pelletized wood), integrated into a gas stove for either such as commercial or military use, associated with an industrial furnace flue, associated with an automobile or other internal combustion engine exhaust system, or associated with a municipal or commercial solid waste disposal/generator. Also, while various applications may be practiced, variations of modules resulting from different configurations may be practiced, for creation of modules such as adapted for generating several Watts or more of power, and for operating with hot side temperatures on the order of 300 to 800 degrees C., with temperature differentials (ΔT) of 100 degrees C. or higher.

With reference to FIGS. 4A-4B (generally FIG. 4), there is illustrated a first exemplary assembly configuration for a TEG constructed in accordance with the presently disclosed subject matter. In accordance with such first exemplary assembly configuration, elements 408, 410 are mounted on substrate 416 as previously described with reference to FIG. 1 and a low conductivity foam material is back-filled between elements 408, 410. In order to create a hermetic sealed package, edges 440, 442 (as well as the other unseen edges) between alumina substrates 414, 416 may be sealed with glass-seal tailored for alumina thermal expansion. In such case, lead-wires 430, 432 may be attached to bonding pads or terminal connections 420, 422, respectively, with high-temperature material, for example and without limitation, a CuAg braze and then covered with glass-seal 444, 446.

With brief reference back to FIG. 2, in accordance with a second exemplary assembly configuration per presently disclosed subject matter, an assembly 250 following firing in an inert atmosphere may be back-filled with low conductivity foam in the same manner as described hereinabove with reference to FIGS. 4A and 4B. In the same manner as described herein, edges between alumina substrates may be sealed with glass-seal tailored for alumina thermal expansion to create a hermetically sealed package. In such case also, lead-wires may be attached with high-temperature material, for example and without limitation, a CuAg braze. In such case, there would be no addition separate requirement for covering lead wire connection points as such would be covered by the back-fill material as the lead connection terminals are fully covered by the sandwiched substrates.

With reference now to respective FIGS. 5A-5D (generally FIG. 5), there is illustrated a further exemplary assembly configuration 500 per presently disclosed subject matter wherein pre-metallized (representatively illustrated as metallization 506) elements 508, 510 are potted in high-temperature foam 540 using a fixture to ensure that elements 508, 510 are co-planar. After potting material 540 is cured, the potted elements are lapped to expose elements 508, 510, and thick film terminations 502 are applied to ends of elements 508, 510 to form a series connected (or series/parallel connected) array of n- and p-elements on both hot and cold surfaces. After firing thick film terminations 502, a high temperature, high thermal conductivity, electrically insulating adhesive 560 is preferably used to bond thin alumina covers 514, 516 to hot and cold surfaces. Lead wires 530, 532 may be bonded to cold-side substrate 516 prior to bonding to the potted array of the TEG elements 508, 510. After the high temperature adhesive 560 is cured, edges 540, 542 (as well as the other two unseen edges) are sealed with glass frit 544 that matches thermo-mechanically properties of alumina-glass seal to create a hermetically sealed package. The sealing provided by the alumina-glass frit 544 seal is most easily seen in FIG. 5D which corresponds to a cross-section of FIG. 5C along section line 5-5.

With reference now to respective FIGS. 6A-6D (generally FIG. 6), there is illustrated a still further exemplary assembly configuration 600 per presently disclosed subject matter wherein an array of un-metallized as-fired green-diced n- and p-type elements 608, 610 are potted using low thermal conductivity foam 640. After the array "tile" is cured, the tile may be lapped or ground to planarize upper and lower surfaces. Thick film terminations 602 are then applied to ends of the elements to form a series connected (or series/parallel connected) array of n- and p-elements on both hot and cold surfaces. After firing the thick film terminations, a high temperature, high thermal conductivity, electrically insulating adhesive 660 is employed to bond thin alumina covers 614, 616 to hot and cold surfaces respectively. Lead wires 630, 632 may be bonded to cold-side substrate 616 prior to bonding to the potted array of TEG elements. After high temperature adhesive 660 is cured, the edges of upper-lower alumina covers 614, 616 may be sealed with glass frit 644 that matches thermo-mechanically properties of alumina-glass seal to create an heretically sealed package. The sealing provided by the alumina-glass frit 644 seal is most easily seen in FIG. 6D which corresponds to a cross-section of FIG. 6C along section line 6-6.

Figure 7B:
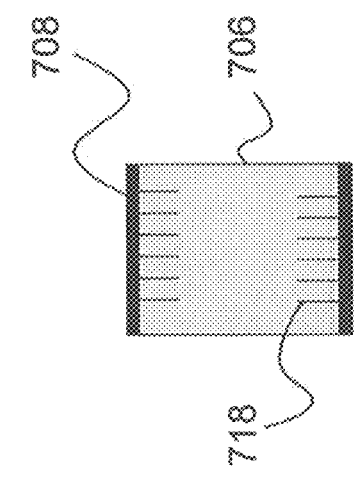
FIGS. 7A-7D respectively illustrate various 3-D and cross-sectional views of presently disclosed exemplary TEG elements incorporating various metallic components for providing improved bonding and electrical contact.
Figure 7D:
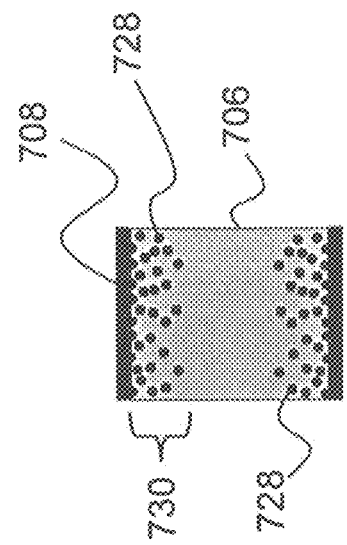
Figure 7A:
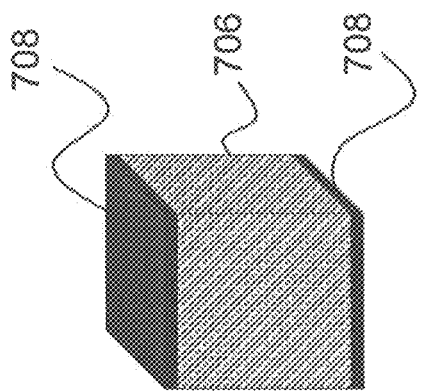
Figure 7C:
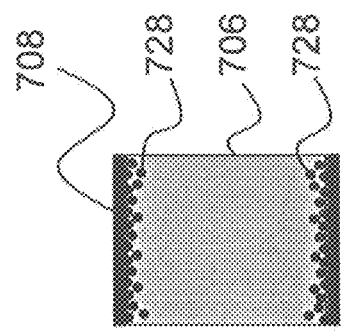

With reference now to respective FIGS. 7A-7D, there are illustrated views of TEG elements including a 3-D view in FIG. 7A and cross-sectional illustrations in FIGS. 7B-7D illustrating engineering aspects of element construction in accordance with the presently disclosed subject matter. With reference to FIG. 7A it should be appreciated that element 706 is a 3-D representation of an element including metallization 708 on both upper and lower ends of element 706. Such element 706 is identical to element 106 of FIG. 1 and is reproduced for ease of comparison with FIGS. 7B-7D. Such FIGS. 7B-7D illustrate various embodiments including bonding assisting metallic components incorporated into element 706. For example, FIG. 7B illustrates the use of tabs 718 extending from the end surface of element 706. In similar manner, FIGS. 7C and 7D illustrate the use of metallic particles 728 proximate respective end portions of elements 706 that function in part as anchor points for bonding metallization 708. As illustrated in FIG. 7D, additional metallic particles may be configured in a graded manner in area 730 proximate the ceramic-metal interface to assist in bonding as well as providing thermal and electrical advantages.

As previously noted, such metallic particles may include, for example and without limitation, metals such as nickel, copper, silver, palladium. Such metals may be added to the slip or feedstock to create a ceramic/metal composite in given layers, particularly outer contact surfaces that may be advantageous in creating improved electrical contact with external metallization or matching thermal expansion of elements and contacting substrates or headers. By using slip, tape, or feedstock compositions with varying levels of metal particles or none to construct elements 706, a variety of advantageous designs may be employed. For example, layers of gradually reduced metal particle concentration may be stacked to create a graded transition from metallized surface to dense ceramic, reducing mechanical and thermal stresses between regions, as illustrated most clearly in FIG. 7D.

With reference to respective FIGS. 8A-8D, there are illustrated several embodiments of TEG elements 806 including porosity-creating inclusions 818. Porosity-creating inclusions, such as polymer microspheres (for example, but not limited to, poly(methyl methacrylate) microspheres) or glass microballoons may also be added to the slip or feedstock. During burnout and firing, polymer microspheres will burn out of the composition, leaving porosity of a controlled size behind. In exemplary configurations, such size may range from 1 to 40 microns in diameter in the ceramic element 806. In a similar manner, glass microballoons will react with the ceramic composition during firing, leaving voids of similar size.

Such porosity may be used in three important ways. First, it may be used to create additional surface area at the surface of a ceramic element 806 where an intimate metallic contact between the ceramic article and any external metallization 808 is to be used for bonding. Second, it may be used to decrease the thermal conductivity of the ceramic element 806, which would positively impact the ceramic element's thermoelectric figure of merit. Third, it may be used to modify the thermal expansion coefficient of an element to achieve a closer match to bonding materials or header materials.

Figure 8B:
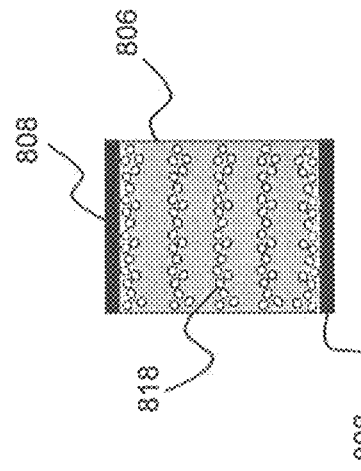
FIGS. 8A-8D respectively illustrate various cross-sectional views of presently disclosed exemplary TEG elements incorporating various porosity-creating inclusions.
Figure 8D:
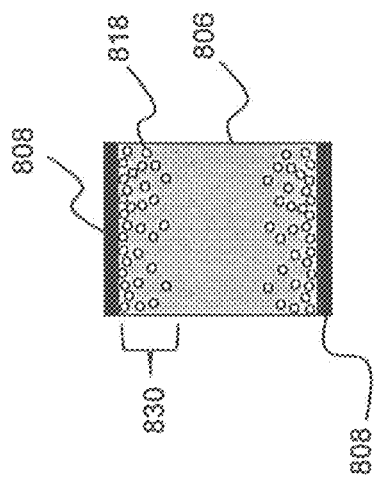
Figure 8A:
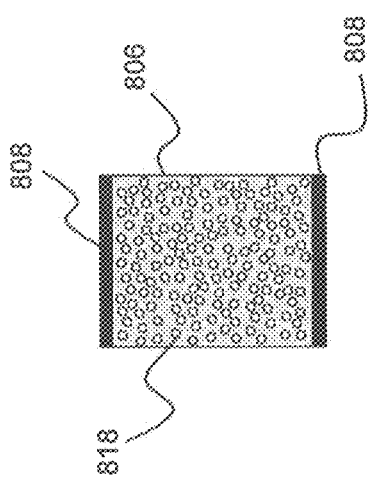
Figure 8C:
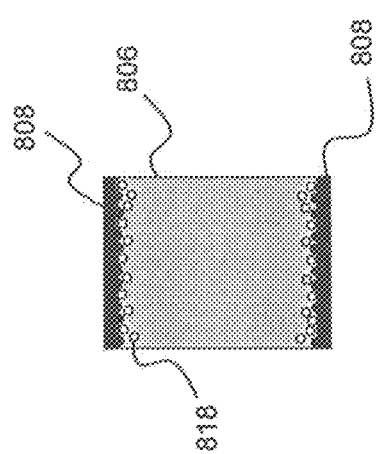

By using slip, tape, or feedstock compositions with varying levels of inclusions 818 or no inclusions to construct elements 806, a variety of advantageous designs may be employed. For example, the porosity may only be positioned at the surface of the element and exposed by lapping such as illustrated in FIG. 8C. The additional surface area created increases the contact area between ceramic and metal, improving mechanical and electrical contact. The porosity may also be applied in layers such as illustrated in FIG. 8B, creating areas of enhanced electrical conductivity in series with areas of enhanced thermal resistance. In another case, layers of gradually reduced porosity such as illustrated in FIG. 8D may be stacked to create a graded transition from porous ceramic to dense ceramic, reducing mechanical and thermal stresses between regions. It should be appreciated by those of ordinary skill in the art that combinations of metallic and porosity-creating inclusions may be employed together in the same ceramic elements to provide additional advantages, all within the scope of the presently disclosed subject matter.

Figure 9:
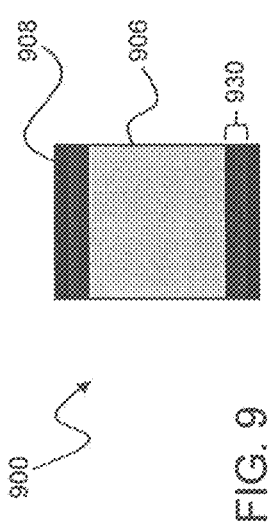
FIG. 9 illustrates an alternate embodiment of the presently disclosed subject matter employing heavily doped layers of ceramic material.

With reference to FIG. 9, there is illustrated an alternate embodiment 900 of the presently disclosed subject matter employing heavily doped layers 930 of ceramic material to improve contact resistance. As may be seen with reference to FIG. 9, heavily doped regions 930 near electrode surfaces 908 may be provided to improve contact resistance in a manner similar to that achieved by the various embodiments illustrated in FIGS. 7C and 7D. As previously noted, a slip or feedstock with an excess of donor ions for n-type materials and acceptor ions for p-type materials may be used to heavily dope the outer layers of the blanks, where external metallization may be brought in contact with the materials.

Figure 10:
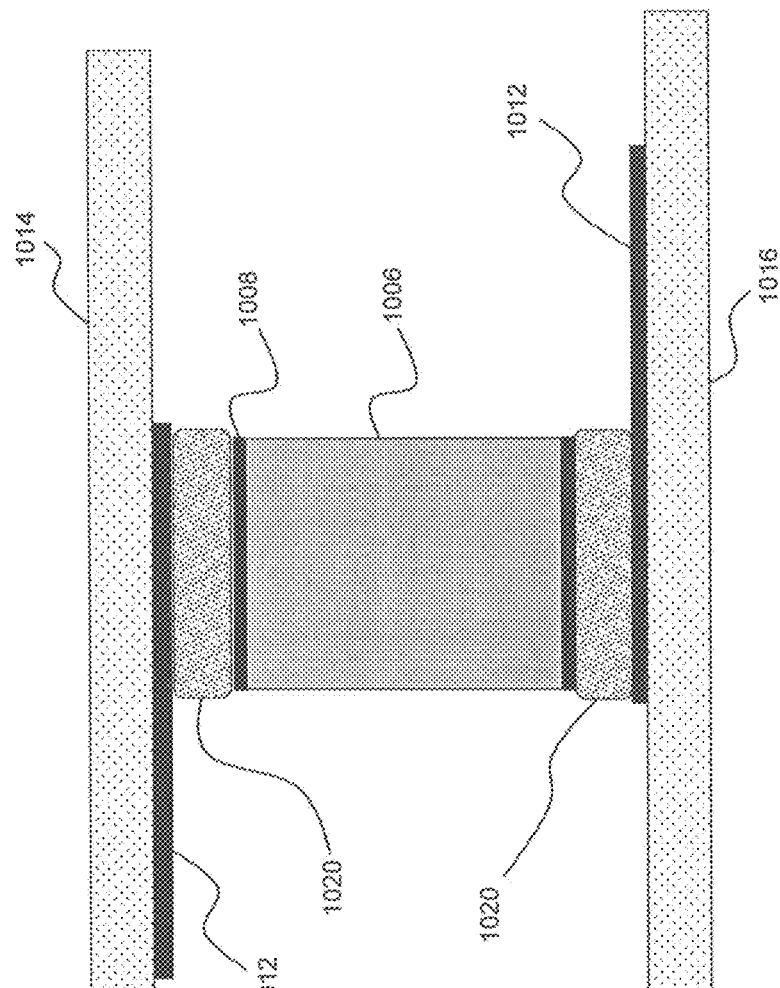
FIG. 10 illustrates a cross-section of a portion of an additional alternate embodiment of the presently disclosed subject matter employing thick film composite terminations.

Referring now to FIG. 10, there is illustrated a cross-section of a portion of an additional alternate embodiment 1000 of the presently disclosed subject matter employing thick film composite terminations. As illustrated, such embodiment provides a top header 1014 and bottom header 1016 each with patterned conductive interconnections 1012 for coupling different types of elements in series as previously described. In the embodiment illustrated in FIG. 10, thick film composite terminations 1020 may be provided between elements 1006's metallic bonding layers 1008 and patterned conductive interconnections 1012 to mitigate thermal stresses between headers 1014, 1016, metallizations 1012, and elements 1006. In exemplary embodiments thick film composite terminations 1020 may correspond to ceramic/glass/metal composite structures.

Figure 11A:
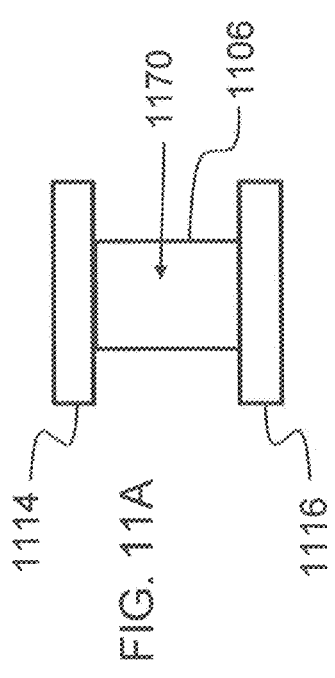
FIGS. 11A-11C respectively illustrate cross-sectional drawings of exemplary tapered configurations of TEG elements in accordance with further alternate embodiments of the presently disclosed subject matter.
Figure 11B:
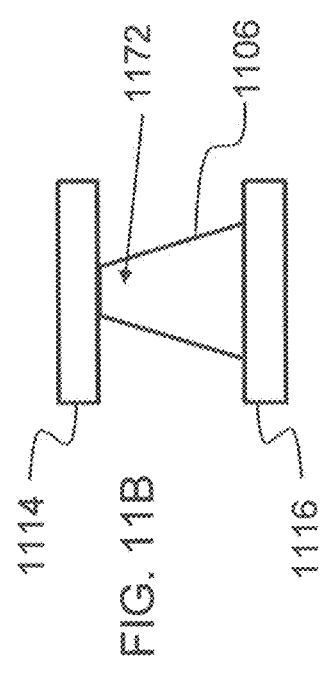
Figure 11C:
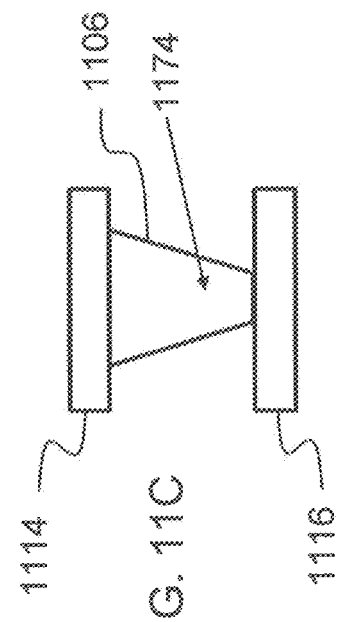

Referring now to respective FIGS. 11A-11C, there are illustrated cross-sectional drawings of exemplary tapered configurations of TEG elements 1106 in accordance with further alternate embodiments of the presently disclosed subject matter. As illustrated, in each of FIGS. 11A-11C, TEG element 1106 is placed between a heat source 1116 generally at a temperature T1 and a heat sink 1114 generally at a temperature T2. Arrows 1170, 1172, 1174 point generally to areas of their respective element 1106 where the average temperature is (T1+T2)/2. Thus, as may be seen from FIGS. 11A-11C, the average temperature 1170 for a generally rectangular element 1106 is close to the middle of element 1106. On the other hand, for the tapered element of FIG. 11B, the average temperature is instead relatively closer to the cold side at heat sink 1114 while in the tapered element of FIG. 11C, the average temperature area indicated by arrow 1174 is relatively closer to the hot side at heat source 1116.

Figure 12:
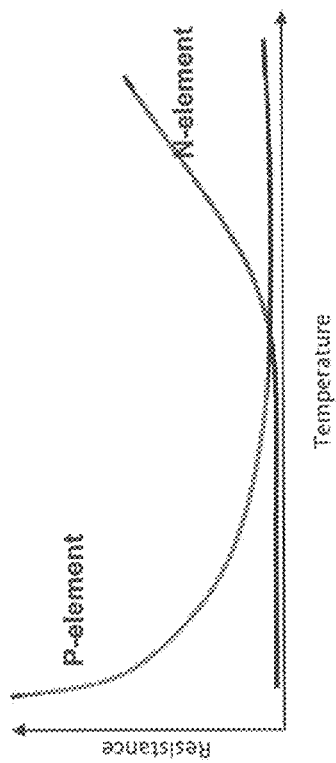
FIG. 12 is a graphical illustration of temperature vs. resistance attributes for n-type and p-type elements in the context of presently disclosed subject matter.

The effect of such temperature variation may be observed with reference to FIG. 12. With respect to TEG elements, voltage generated by a p-type and n-type pair of elements is determined by the difference in temperature $\Delta T$ where $\Delta T = T1 - T2$. Resistance (R) is determined by the average temperature. Power (P) generated is determined as $P = V^2/R$. On the one hand, p-type elements have high resistance at low temperature, decreasing as temperature increases. On the other hand, n-type elements have low resistance at low temperatures, increasing as temperature increases. Elements with different cross-sectional areas on hot and cold side will have non-linear thermal gradients although the difference in temperature $\Delta T$ will be the same. It would be advantageous, therefore, to one of ordinary skill in the art, to tailor the average resistance as desired using the assistance of a shape of temperature vs. resistance profile as illustrated in FIG. 12.

It should be appreciated that while the presently disclosed subject matter provides for adjustment of physical shape (for example, in one instance, taper) of the TEG elements, additional tailoring of the responses of such tapered elements may be implemented using other techniques described hereinabove, including the addition of tabs and metallic particles as illustrated in FIGS. 7B-7D, the provision of porosity-creating inclusions as illustrated in FIGS. 8A-8D, and/or the use of heavy doping as illustrated in FIG. 9.

Figure 13:
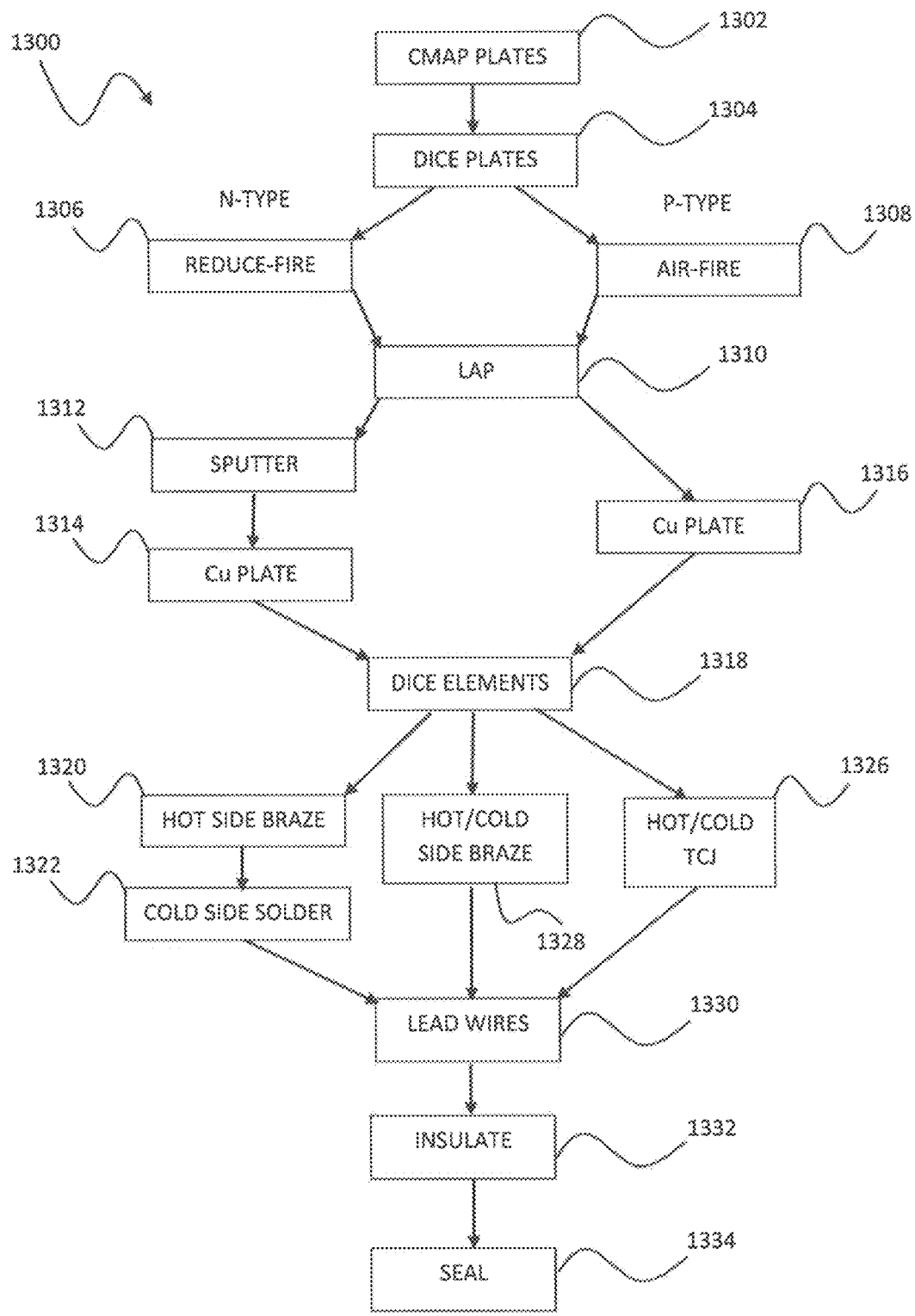
FIG. 13 is a flow chart illustrating exemplary methodology for constructing thermoelectric devices in accordance with the presently disclosed subject matter.

With reference to FIG. 13, there is illustrated a flow chart 1300 illustrating exemplary methodology for constructing thermoelectric devices in accordance with the presently disclosed subject matter. As may be seen from flow chart 1300, devices constructed in accordance with the presently disclosed subject matter are first formed as plates (step 1302) using standard ceramics technology known as Chip Manufacturing Automated Process (CMAP). Such process results in large plates of n-type or p-type materials that may be diced (step 1304) and further processed depending on the type of materials produced in step 1302.

In the instance that the material is an n-type material, the diced plates may be reduced-fired (step 1306) and then lapped (step 1310) to provide smooth, flat surfaces on the top and bottom of the plates. In the instance that the material is a p-type mater, such may be air-fired (step 1308) prior to lapping. Following the lapping process, and again dependent on the type of materials, n-type material may be sputtered (step 1312) and then plated with copper (step 1314) while p-type materials will generally only require the copper plating step 1316.

Following the plating process, the plates are diced into individual elements at step 1318. Such individual elements are such as those illustrated as element 106 in FIG. 1 and the element illustrated in FIG. 7A. Again depending on type of element being processed, the diced elements are either hot side brazed (step 1320) and cold side soldered (step 1322) or hot and cold side brazed (step 1328) or assembled together under pressure (step 1326) without brazing or soldering such as illustrated in FIG. 3D.

Lead wires are then attached (step 1330) and, in selected embodiments, insulation is provided around individual elements (step 1332) where a low conductivity foam material is back-filled between elements and finally, again in selected embodiments, the device is sealed (step 1334) with appropriate materials such as with a glass-seal tailored for thermal expansion with the other components of the thermoelectric device.

Figure 14:
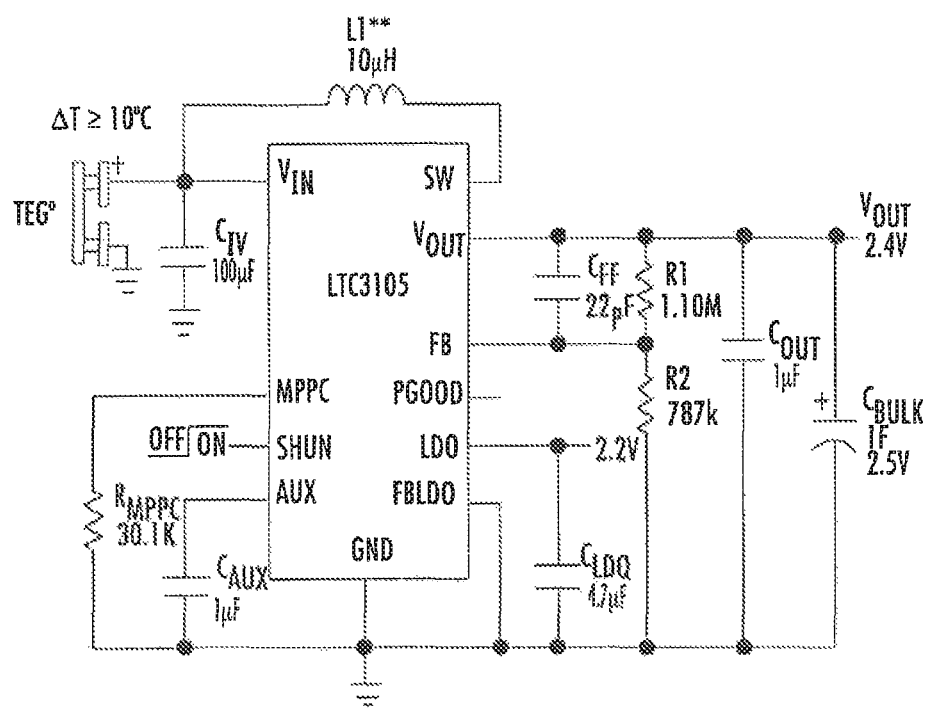
FIG. 14 is a schematic diagram illustrating exemplary use of a thermoelectric device constructed in accordance with the presently disclosed subject matter to charge a storage device.

With reference to FIG. 14, there is shown an exemplary schematic diagram of a thermoelectric device or generator constructed in accordance with the presently disclosed subject matter configured for use to charge a storage device. In such exemplary circuit, a Linear LTC3105 Voltage Converter is employed to convert voltage generated from an exemplary representative presently disclosed thermoelectric generator (TEG) to a useful level to be used for such purposes as charging a cell phone. It should be recognized that thermoelectric devices (TEDs) or TEG's (re generators) constructed in accordance with the presently disclosed subject matter produce a relatively low voltage while producing such at a relatively high current. Circuits such as the exemplary circuit of FIG. 14 are designed using known design techniques to boost (multiply) such low voltages to appropriate levels while regulating the higher voltages produced to match the thermal energy harvesting goals to a desired voltage and power output level, all as will be understood by those of ordinary skill in the art without requiring additional detailed disclosure thereof. One exemplary desired level is 2.4 volts, such as for charging a super capacitor. While the presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter as would be readily apparent to one of ordinary skill in the art.

What is claimed is:

1. A charging circuit for charging a storage device, comprising:
    a thermoelectric generator module for converting thermal energy to electrical energy based on temperature differences between portions of the module based on the Peltier/Seebeck effect, comprising:
        a plurality of N-type oxide ceramic elements comprising an N-type ceramic material;
        a plurality of P-type oxide ceramic elements comprising a P-type ceramic material and respectively paired with said plurality of N-type elements;
        a pair of supporting ceramic substrates, supporting a plurality of conductive traces thereon, and with said paired N-type and P-type elements received on selected of said conductive traces so as to form an array of such pairs between said substrates, with said paired elements electrically connected in series by said conductive traces and thermally connected in parallel relative to said substrates; and
        a pair of output terminals provided on at least one of said substrates and configured to provide an output voltage from said module; and
    a voltage converter electrically connected with at least one of the pair of output terminals and configured to receive the output voltage from said module and convert said module output voltage to a relatively higher output voltage that is suitable for charging the storage device;
    wherein the plurality of N-type elements the plurality of P-type elements comprise a plurality of porosity layers that are spaced apart in a heat-flow direction perpendicular to said generally planar ceramic substrates, the plurality of porosity layers having thicknesses in the heat-flow direction that range from 1 micron to 100 microns, and wherein the plurality of porosity layers comprise pores formed inside the N-type ceramic material and P-type ceramic material.

2. The charging circuit as in claim 1, wherein said voltage converter is configured to regulate said relatively higher output voltage to 2.4 volts.

3. The charging circuit as in claim 1, wherein said plurality of N-type elements and said P-type elements of said thermoelectric generator module further comprise non-uniform concentrations of at least one of metallization or chemical composition of said N-type elements and said P-type elements.

4. The charging circuit as in claim 1, wherein said substrates of said thermoelectric generator module comprise planar constructions capturing said array of paired elements between said substrates.

5. The charging circuit as in claim 4, wherein said conductive traces comprise complementary patterns of screen-printed, fired metallizations formed on said substrates.

6. The charging circuit as in claim 1, further including:
    potting material captured between said substrates of said thermoelectric generator module in between said array pairs; and
    hermetic sealing material surrounding the peripheral edges of said potting material, for hermetically sealing said module.

7. The charging circuit as in claim 1, wherein the thicknesses in the heat-flow direction of the plurality of porosity layers range from 2 microns to 100 microns.

8. The charging circuit as in claim 1, wherein the thicknesses in the heat-flow direction of the plurality of porosity layers range from 10 microns to 100 microns.

9. The charging circuit as in claim 1, wherein the thicknesses in the heat-flow direction of the plurality of porosity layers range from 20 microns to 100 microns.

10. Methodology for charging a storage device, comprising:
    providing a thermoelectric generator module for converting thermal energy to electrical energy based on temperature differences between portions of the module based on the Peltier/Seebeck effect, comprising:
        a plurality of N-type oxide ceramic elements comprising an N-type ceramic material;
        a plurality of P-type oxide ceramic elements comprising a P-type ceramic material and respectively paired with said plurality of N-type elements; and
        a pair of supporting ceramic substrates, supporting a plurality of conductive traces thereon, and with said paired N-type and P-type elements received on selected of said conductive traces so as to form an array of such pairs between said substrates, with said paired elements electrically connected in series by said conductive traces and thermally connected in parallel relative to said substrates; and a pair of output terminals provided on at least one of said substrates and configured to provide an output voltage from said module;

wherein the plurality of N-type elements and the plurality of P-type elements comprise a plurality of porosity layers that are spaced apart in a heat-flow direction perpendicular to said generally planar ceramic substrates, the plurality of porosity layers having thicknesses in the heat-flow direction that range from 1 micron to 100 microns, and wherein the plurality of porosity layers comprise pores formed inside the N-type ceramic material and P-type ceramic material; and charging the storage device using a voltage converter that is electrically connected with at least one of the pair of output terminals and configured to receive the output voltage from said module and convert said module output voltage to a relatively higher output voltage that is suitable for charging the storage device.

11. The methodology as in claim 10, further including regulating said converter higher output voltage said relatively higher output voltage to 2.4 volts.

12. The methodology as in claim 10, wherein said plurality of N-type elements and said P-type elements of said thermoelectric generator module further comprise non-uniform concentrations of at least one of metallization or chemical composition of said elements.

13. The methodology as in claim 10, wherein said substrates of said thermoelectric generator module comprise planar constructions capturing said array of paired elements between said substrates, and said conductive traces comprise complementary patterns of screen-printed, fired metallizations formed on said substrates.

14. The methodology as in claim 10, further including:
providing potting material captured between said substrates of said thermoelectric generator module in between said array pairs; and
hermetically sealing said module.

15. The methodology as in claim 10, wherein the thicknesses in the heat-flow direction of the plurality of porosity layers range from 2 microns to 100 microns.

16. The methodology as in claim 10, wherein the thicknesses in the heat-flow direction of the plurality of porosity layers range from 10 microns to 100 microns.

17. The methodology as in claim 10, wherein the thicknesses in the heat-flow direction of the plurality of porosity layers range from 20 microns to 100 microns.

* * * * *